United States Patent [19]

Polinski, Sr.

[11] Patent Number: 5,708,570
[45] Date of Patent: Jan. 13, 1998

[54] SHRINKAGE-MATCHED CIRCUIT PACKAGE UTILIZING LOW TEMPERATURE CO-FIRED CERAMIC STRUCTURES

[75] Inventor: Paul W. Polinski, Sr., Dana Point, Calif.

[73] Assignee: Hughes Aircraft Company, Los Angeles, Calif.

[21] Appl. No.: 540,735

[22] Filed: Oct. 11, 1995

[51] Int. Cl.⁶ .............................. H01G 4/12; H05K 1/16; B32B 18/00

[52] U.S. Cl. .................. 361/762; 361/321.2; 361/321.4; 361/313; 361/320; 361/763; 361/766; 428/210; 428/212

[58] Field of Search .................. 361/320, 321.1, 361/321.2, 321.3, 321.4, 321.5, 322, 311-313, 763, 766, 782, 792, 811, 762; 174/52.4; 428/206, 209, 210, 212

[56] References Cited

U.S. PATENT DOCUMENTS

| | | | |
|---|---|---|---|
| 4,861,646 | 8/1989 | Barringer et al. | 428/210 |
| 5,055,966 | 10/1991 | Smith et al. | 361/321.3 |
| 5,144,526 | 9/1992 | Vu et al. | 361/321.1 |
| 5,242,867 | 9/1993 | Lin et al. | 501/32 |
| 5,387,474 | 2/1995 | Mikeska et la. | 428/688 |
| 5,604,673 | 2/1997 | Washburn et al. | 361/782 |

OTHER PUBLICATIONS

Ramona G. Pond et al., "Processing and Reliabiity of Resistors Incorporated Within Low Temperature Cofired Ceramic Structures", *1996 ISHM proceedings*, pp. 461-472.

H. T. Sawhill et al., "Low Temperature Co-Fireable Ceramics with Co-Fired Resistors", *1986 ISHM Proceedings*, pp. 473-480.

H. Nishikawa et al., "Development of Zero X-Y Shrinkage Sinterd Ceramic Substrate", *Proceedings of the Japan International Electronic Manufacturing Technology Symposium*, (1993) pp. 238-241.

William A. Vitriol et al., "Development of a Low Temperature Cofired Multilayer Ceramic Technology", *1983 ISHM Proceedings*, pp. 593-598.

*Primary Examiner*—Leo P. Picard
*Assistant Examiner*—John B. Vigushin
*Attorney, Agent, or Firm*—M. E. Lachman; M. W. Sales; W. K. Denson-Low

[57] ABSTRACT

A glass-ceramic substrate for encapsulating an electronic component, with at least two shrinkage control layers restricting shrinkage of the substrate during a co-firing process. The shrinkage control layers are chosen so that they have substantially the same shrinkage characteristics, during co-firing, as the buried electronic component. This results in substantially no differential shrinkage between the electronic component and the substrate, along predetermined directions, during co-firing. In addition, the thermal expansion coefficients of the substrate, shrinkage control layers and electronic component are chosen so that they substantially match, such that their thermal-induced contraction during the cooling phase of the co-firing process substantially match. In the preferred embodiment, the electronic component is buried within the layers of an LTCC structure. The shrinkage control layers are preferably implemented as $Al_2O_3$ or $TiO_2$ filled dielectric green tape layers on top and bottom LTCC layers. A buried capacitor LTCC package is specifically disclosed.

13 Claims, 2 Drawing Sheets

SHRINKAGE-MATCHED CIRCUIT PACKAGE UTILIZING LOW TEMPERATURE CO-FIRED CERAMIC STRUCTURES

BACKGROUND OF THE INVENTION

1. Field of the Invention

This invention relates to hybrid microcircuit packages, and more particularly to electronic components encapsulated in shrinkage-matched low temperature co-fired ceramic (LTCC) packages.

2. Description of the Related Art

LTCC technology is generally well known. For a discussion of the development and use of LTCC structures, see William A. Vitriol et al., "Development of a Low Temperature Cofired Multilayer Ceramic Technology," 1983 *ISHM Proceedings*, pages 593–598.

LTCC structures are particularly suitable for packaging passive electronic components, such as resistors, capacitors and inductors. The LTCC processing techniques used to package such structures are well known, and are described in Ramona G. Pond et al., "Processing and Reliability of Resistors Incorporated Within Low Temperature Cofired Ceramic Structures," 1986 *ISHM Proceedings*, pages 461–472; H. T. Sawhill et al., "Low Temperature Co-Fireable Ceramics with Co-Fired Resistors," 1986 *ISHM Proceedings*, pages 473–480; and in the William A. Vitriol et al. article cited above.

Generally, individual layers of LTCC tape are used to form the LTCC structure. Conductor metallization patterns and the materials that form the passive electronic components are deposited on the individual tape layers. The tape layers are then stacked on top of each other, and co-fired at a temperature below 1,000 degrees Celsius for a predetermined length of time. The co-firing process drives off organic materials from the tape layers, resulting in a densified monolithic ceramic package with the passive components buried within it. The co-firing process causes the LTCC material to shrink, with the final co-fired LTCC package being approximately 10 to 15 percent smaller than the original stacked layer structure. The passive components buried within the LTCC structure may also shrink during co-firing, depending on their composition, but usually by a different amount than the LTCC structure.

Differences in the shrinkage characteristics between the LTCC material and the materials that make up the electronic components cause distortion, cracking and bowing of the LTCC package during the co-firing process. In addition, differences in the thermal coefficients of expansion between the LTCC material and the electronic components cause differential thermal-induced contraction during the cool-down phase of the co-firing process, after the LTCC material has solidified. This differential contraction creates stress that could also cause cracking and distortion of the final LTCC package. A prior LTCC package that addresses the differential shrinkage problem is described in U.S. Pat. No. 5,144,526, entitled "LOW TEMPERATURE CO-FIRED CERAMIC STRUCTURE CONTAINING BURIED CAPACITORS", issued Sep. 1, 1992 to Thanh Vu, et al., and assigned to Hughes Aircraft Company, the assignee of the present invention.

In this package, a capacitor is buried in the LTCC package by placing an equal thickness of LTCC tape layers above and below the capacitor. The capacitor comprises two electrodes separated by a high K dielectric material. The LTCC tape layers are stacked above and below the capacitor so that they are symmetric with respect to the center of the high K dielectric material. This design reduces the shrinkage-induced effects described above during the co-firing process. However, the need for symmetrically locating the capacitor with respect to the LTCC material reduces design flexibility.

An LTCC structure that exhibits low overall shrinkage during the co-firing process is described in H. Nishikawa et al., "Development of Zero X-Y Shrinkage Sintered Ceramic Substrate," *Proceedings of the Japan International Electronic Manufacturing Technology Symposium*, (1993), pages 238–241. In this structure, shrinkage control layers, typically $Al_2O_3$ dielectric green tape, are placed at the top and bottom of the LTCC tape stack. The shrinkage control layers restrict shrinkage of the LTCC stack along x and y directions during the co-firing process, so that the size of the LTCC structure changes by only 0.1 percent or less along the x and y directions during the co-firing process.

This structure was developed for LTCC applications which do not utilize buried electronic components. For example, LTCC materials are commonly used as substrates for high frequency electronic interconnects. For high frequency applications, the separation between the metallization patterns that make up the interconnects must be very precisely controlled. One way to achieve this control is to eliminate or reduce the total x and y shrinkage of the LTCC substrate. In contrast, for LTCC applications involving buried electronic components, it is the differential shrinkage between the LTCC material and the buried component that are of concern, rather than the absolute shrinkage of the LTCC material. Also, since this structure does not utilize buried components, the thermal contraction problems encountered during the cool-down phase of the co-firing process are not addressed.

SUMMARY OF THE INVENTION

In view of the above problems, the present invention provides a microcircuit package for encapsulating electronic components which substantially reduces or eliminates differential-shrinkage-induced distortion, cracking or bowing during co-firing, and stress due to thermal contraction during the cool-down phase of the co-firing process, while exhibiting greater design flexibility than prior multilayer microcircuit packages.

This is accomplished by providing a glass-ceramic substrate for encapsulating an electronic component, with shrinkage control layers along portions of the substrate for restricting shrinkage of the substrate during a co-firing process. The control layers melting temperature is greater than the substrate melting temperature so that, during co-firing, molecular bonding between the substantially solid control layers and the melted substrate forces the shrinkage of the substrate to substantially follow that of the control layers along predetermined directions. The control layers are chosen so that they have substantially the same shrinkage characteristics, during co-firing, as the buried electronic component. This results in substantially no differential shrinkage between the electrical component and the substrate, during co-firing, along these directions. In addition, the thermal expansion coefficients of the substrate, shrinkage control layers and electronic component are chosen so that they substantially match, such that their thermal-induced contraction during the cooling phase of the co-firing process substantially match.

In the preferred embodiment, the electronic component is buried within the layers of an LTCC structure. The shrinkage control layers are preferably non-metallic power-filled dielectric tape layers on top and bottom LTCC layers, and are positioned so that substrate shrinkage during co-firing is restricted along the length and width directions of the electronic component. In one embodiment the electronic component is a buried capacitor.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
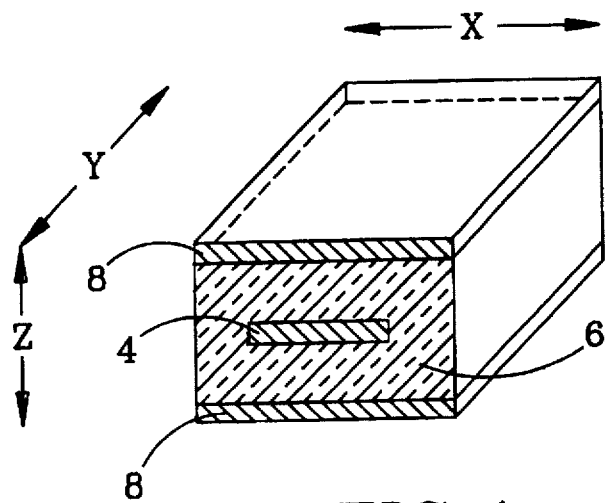
FIG. 1 is a partially sectional perspective view of a generic microcircuit package built in accordance with the present invention.

FIG. 1. illustrates the basic principles of the invention. An electronic component 4 is encapsulated in a glass-ceramic substrate 6. Shrinkage control layers 8 are disposed along portions of the glass-ceramic substrate 6. The shrinkage control layers 8 must have a melting temperature greater than the melting temperature of the glass-ceramic substrate 6, and their shrinkage properties during co-firing are substantially the same as those of the electronic component 4. In addition, the thermal expansion coefficients of the shrinkage control layers 8, substrate 6 and electronic component 4 substantially match.

The shrinkage control layers 8 are preferably polymer-plasticizer-solvent mixtures, preferably DuPont™ green tape, filled with non-metallic powder. These tapes are available commercially from DuPont De Nemours & Company with a variety of non-metallic powders embedded in them, such as $Al_2O_3$ and $TiO_2$. The type of powder in the green tape determines its melting temperature and thermal expansion coefficient, so green tape with powder that exhibits the desired melting temperature and thermal expansion coefficient is preferably used as the shrinkage control layers 8.

The non-metallic powder in the shrinkage control layers 8 is packed tightly enough so that it exhibits less shrinkage than the substrate 6 during co-firing. The amount of powder in the layer determines its overall shrinkage during co-firing. During co-firing, the non-metallic particles in the shrinkage control layers 8 remain solid and molecularly bond with the melted glass-ceramic substrate 6, which causes the overall shrinkage of the substrate 6 to follow that of the shrinkage control layer 8 along directions that are parallel to the plane on which the shrinkage control latter 8 lies. In FIG. 1, this plane is defined as an x-y plane, so that the substrate's shrinkage during co-firing is restricted along the x and y directions. For a discussion of shrinkage control layers on ceramic substrates, see the H. Nishikawa et al. article discussed above.

Since the electronic component 4 is comprised of material with substantially the same shrinkage characteristics as the shrinkage control layers 8, their overall shrinkage match along the x and y directions during co-firing.

To compensate for the restricted shrinkage along the x and y directions during co-firing, the ceramic substrate 6 will shrink along the z direction. However, the applicants have found that distortion, cracking and bowing of the package can be substantially reduced or eliminated by restricting differential shrinkage between the electronic component 4 and the substrate 6 along the length and width directions of the electronic component 4 (the x and y directions in FIG. 1). If the electronic component 4 is cube-shaped (equal x, y and z dimensions), the shrinkage control layers 8 may be positioned to control shrinkage along any two orthogonal directions.

During the cool-down phase of the co-firing process the ceramic substrate 6 solidifies, and different rates of thermal-induced contraction between the substrate 6, shrinkage control layer 8 and electronic component 4 could cause stress-induced cracks in the package. To avoid this, the substrate 6 and shrinkage control layer 8 have substantially the same thermal expansion coefficient as the electronic component 4. This can be accomplished by choosing a ceramic substrate and shrinkage control green tape with thermal expansion coefficients that substantially match that of the electronic component. As explained above, a variety of non-metallic-powder-filled green tapes are available commercially, with different thermal expansion coefficients.

Figure 2:
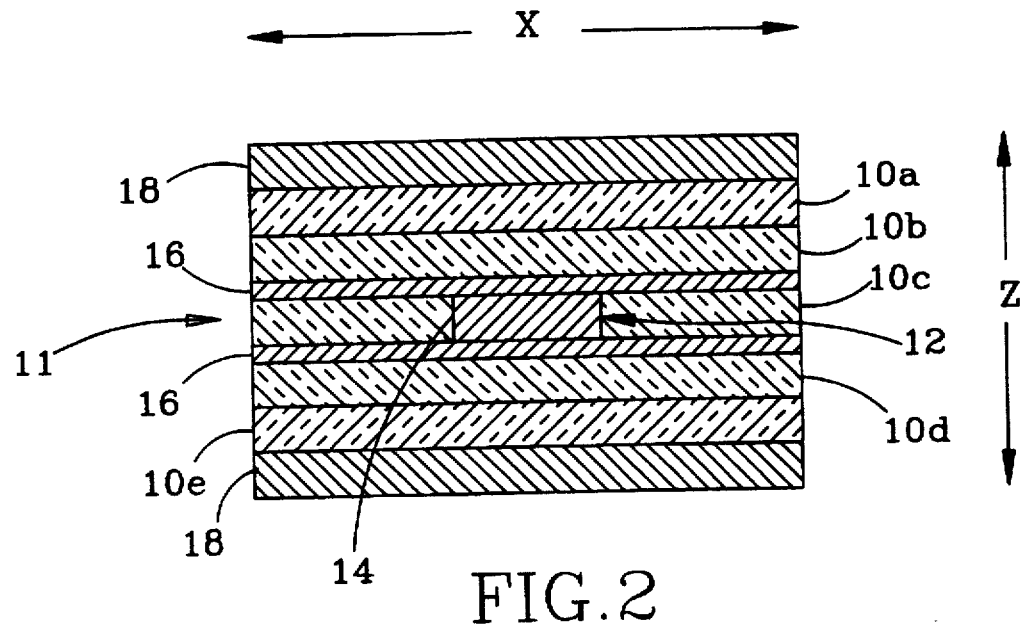
FIG. 2 is a sectional view of an embodiment of the present invention, in which a single capacitor is buried in an LTCC structure.

FIG. 2 illustrates a microcircuit package with a buried capacitor structure, built in accordance with the present invention. The ceramic substrate is preferably a plurality of low dielectric constant (K) LTCC tape layers 10a–10e, preferably Dupont™ 951 green tape. A capacitor structure 11 is formed by depositing capacitor dielectric material 14 in a cavity 12 formed in one of the LTCC layers 10. Metal electrodes 16 are deposited, preferably by silk screening, on the lower surface of the LTCC layer 10b immediately above the capacitor dielectric 14 and on the upper surface of the LTCC layer 10d immediately below the capacitor dielectric 14. The process for fabricating buried capacitors in LTCC layers is described in detail in U.S. Pat. No. 5,055,966, entitled "VIA CAPACITORS WITHIN MULTI-LAYER, 3 DIMENSIONAL STRUCTURES/SUBSTRATES", issued Oct. 6, 1991 to Hal D. Smith et al., and assigned to Hughes Aircraft Company, the assignee of the present invention.

After the capacitor structure 11 is formed, the LTCC layers 10a–10e are stacked and shrinkage control layers 18 are placed on the top and bottom layers 10a and 10e. The shrinkage control layers 18 and LTCC layers are chosen so that their thermal expansion coefficients substantially match that of the capacitor dielectric 14. In the preferred embodiment, the capacitor dielectric 14 and the shrinkage control layers 18 are either $Al_2O_3$ green tape layers or $TiO_2$ green tape layers. $TiO_2$ has a high dielectric constant, which makes it particularly suitable for the capacitor dielectric 14 material. High purity $Al_2O_3$ is a good low dielectric constant powder for low loss high frequency capacitors. The shrinkage control layers 18 are preferably the same thickness as the LTCC layers. As mentioned above, the overall shrinkage of the control layers during co-firing is dependent on the amount of non-metallic powder in the green tape material. For example, if $Al_2O_3$ green tape is used, a density of at least 2.42 g/cm³ should be used for an overall shrinkage during co-firing of less than 0.1 percent. For a discussion of $Al_2O_3$ shrinkage control layers, see, the Nishikawa article cited above.

After all the layers are stacked, the package is co-fired in accordance with the well known LTCC co-firing techniques described in the references listed above. During co-firing, the shrinkage control layers restrict the overall shrinkage of the LTCC layers. Since the capacitor dielectric 14 and shrinkage control layers 18 are made of the same material (with the same shrinkage characteristics during co-firing), their overall shrinkage will substantially match, resulting in substantially reduced or zero differential shrinkage between the capacitor dielectric 14 and the LTCC layers.

During the cool-down phase of the co-firing process, the LTCC layers solidify, and thermal-induced contraction occurs. Since the thermal expansion coefficients of the shrinkage control layers 18, capacitor dielectric 14 and LTCC layers are substantially matched, thermal-induced stress and cracking is substantially reduced or eliminated.

An LTCC microcircuit package with a buried capacitor structure as illustrated in FIG. 2 is an example of the many types of packages that may be constructed. Other electronic components, such as resistors and inductors, may be buried within the LTCC layers. For example, non-metallic powers are available with magnetic properties that increase the quality, value and performance of buried inductors and transformers. Green tape filled with these types of powers may be used to fabricate such components within the LTCC layers without departing from the scope of the invention. In addition, the total number of LTCC layers may be varied to accommodate particular device requirements. In the package of FIG. 2, at least one LTCC layer is preferably used between the capacitor dielectric 14 and the shrinkage control layers 18. Although only top and bottom shrinkage control layers 18 are used in the package of FIG. 2, additional shrinkage control layers may be used, as long as there is at least one LTCC layer between the shrinkage control layer 18 and the capacitor dielectric 14.

If $Al_2O_3$ or $TiO_2$ green tape is used for the shrinkage control layers 18, it may be easily removed after the co-firing process. This is because $Al_2O_3$ and $TiO_2$ have a higher sintering temperature than the LTCC layers. The polymer-plasticer-solvent material (green tape material) in which the $Al_2O_3$ or $TiO_2$ powder is embedded in burns off during co-firing, leaving behind the $Al_2O_3$ or $TiO_2$ powder, which may be brushed off.

In some device applications, it may be desirable to keep the $Al_2O_3$ or $TiO_2$ shrinkage control layers 18 on the package. For example, the metallized $Al_2O_3$ layers may be used as an EMF shield for an EMF sensitive electronic component buried within the LTCC layers. This may be accomplished by using $Al_2O_3$ green tape that contains approximately ½ to 2 percent glass by volume embedded in the green tape material. During co-firing, the glass melts but does not burn off. As a result, the glass solidifies during the cool-down phase (with the $Al_2O_3$ powder embedded within it) and fuses to the LTCC layers.

Figure 3:
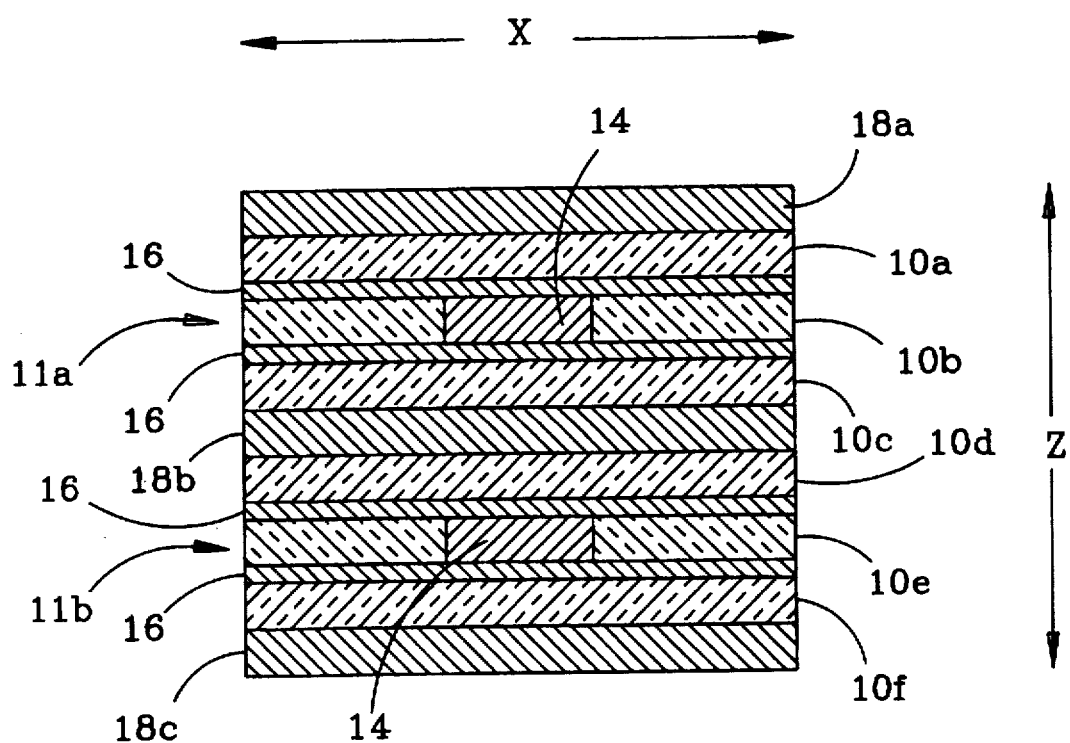
FIG. 3 is a sectional view of an alternate embodiment, in which capacitors are buried on each side of a thermal expansion control layer that is buried within an LTCC structure.

Although the package of FIG. 2 contains only one buried capacitor 11, more than one electronic component may be buried within the LTCC layers, as long as their shrinkage characteristics during co-firing substantially match those of the shrinkage control layers 18, and their thermal expansion coefficients substantially match those of the shrinkage control and LTCC layers. FIG. 3 illustrators a package with two buried capacitors 11a and 11b, with common elements labeled with the same reference numbers used in FIG. 2. In the embodiment of FIG. 3, three shrinkage control layers 18a–18c are used, with one control layer 18b placed between two LTCC layers 10c and 10d, and the other two control layers 18a and 18c placed on the top and bottom LTCC layers 10a and 10f, respectively. Capacitor 11a is formed between control layers 18a and 18b, and capacitor 11b is formed between control layers 18b and 18c. As explained above, whether or not the shrinkage control layers 18a–18c fuse to the LTCC layers during co-firing depends upon whether glass is added to the shrinkage control green tape. If glass is not used, control layers 18a–18c will not fuse to the LTCC layers, the top and bottom control layers 18a and 18c may be brushed off after co-firing, and LTCC layers 10c and 10d may be separated from control layer 18b, resulting in two separate LTCC capacitor packages. This feature may be used to manufacture multiple packages during one co-firing run, with a shrinkage control layer used to separate the eventual individual LTCC packages.

Numerous variations and alternate embodiments will occur to those skilled in the art without departing from the spirit and scope of the invention. Such variations and alternate embodiments are contemplated, and can be made without departing from the spirit and scope of the appended claims.

I claim:

1. A shrinkage-matched circuit package having top and bottom sides, comprising:

a plurality of stacked low temperature co-fired ceramic (LTCC) layer, said stack having top and bottom layers, at least one electronic component buried within said stacked layers, and first and second non-metallic-powder-filled dielectric green tape layers disposed on said top and bottom LTCC layers, respectively, so that shrinkage is restricted along directions parallel to length and width directions of said electronic component during a co-firing process, said powder-filled dielectric green tape layers and said at least one electronic component having substantially equal shrinkage characteristics during said co-firing process, said powder-filled dielectric green tape layers, said at least one electronic component and said plurality of LTCC layers having substantially equal thermal expansion coefficients so that their thermal-induced contraction substantially match during a cooling phase of said co-firing process.

2. The package of claim 1, wherein said non-metallic-powder-filled layers contain about 0.5 to 2 percent glass.

3. The package of claim 1, wherein said at least one electronic component comprises at least one capacitor.

4. The package of claim 3, wherein each of said at least one capacitor comprises:

capacitor dielectric material buried within said stacked LTCC layers, and two electrically conductive layers buried within said stacked LTCC layers, and positioned on opposite sides of said capacitor dielectric material.

5. The package of claim 4, wherein said capacitor dielectric material and said powder-filled dielectric green tape layers comprise $Al_2O_3$ or $TiO_2$ dielectric green tape.

6. The package of claim 5, wherein said capacitor dielectric material is disposed within a cavity in one of said stacked LTCC layers.

7. The package of claim 6, wherein one of said electrically conductive layers is disposed on an LTCC layer located above said capacitor dielectric, and the other is disposed on an LTCC layer located below said capacitor dielectric.

8. The package of claim 1, further comprising a third non-metallic-powder-filled dielectric green tape layer on an LTCC layer located between said top and bottom LTCC layers, with at least three LTCC layers located above and below said third non-metallic-powder-filled layer, respectively.

9. The package of claim 8, wherein at least one electronic component is buried within the LTCC layers above and at least one other electronic component is buried within the LTCC layers below said third powder-filled layer.

10. The package of claim 9, wherein said electronic components comprise capacitors.

11. The package of claim 10, wherein each of said capacitors comprise:

capacitor dielectric material buried within said stacked LTCC layers, and two electrically conductive layers buried within said stacked LTCC layers, and positioned on opposite sides of said capacitor dielectric material.

12. The package of claim 11, wherein said capacitor dielectric material is disposed within a cavity in one of said stacked LTCC layers.

13. The package of claim 12, wherein one of said electrically conductive layers is disposed on an LTCC layer located above said capacitor dielectric, and the other is disposed on an LTCC layer located below said capacitor dielectric.

* * * * *